United States Patent [19]

Mizuno

[11] Patent Number: 5,101,665
[45] Date of Patent: Apr. 7, 1992

[54] SEMICONDUCTOR PRESSURE SENSOR
[75] Inventor: Michihiro Mizuno, Itami, Japan
[73] Assignee: Mitsubishi Denki Kabushiki Kaisha, Japan
[21] Appl. No.: 598,432
[22] Filed: Oct. 16, 1990
[30] Foreign Application Priority Data
  Jul. 5, 1990 [JP] Japan .................... 2-176230
[51] Int. Cl.⁵ ................. G01L 7/08; G01L 9/06
[52] U.S. Cl. ....................... 73/721; 73/727; 73/756; 338/4
[58] Field of Search .............. 73/721, 727, 720, 726, 73/756; 338/4

[56] References Cited
U.S. PATENT DOCUMENTS
4,222,277 9/1980 Kurtz et al. .................. 73/727
4,322,980 4/1980 Suzuki et al. ................ 73/727

Primary Examiner—Donald O. Woodiel
Attorney, Agent, or Firm—Leydig, Voit & Mayer

[57] ABSTRACT

A semiconductor chip with a gauge pressure sensor section and an absolute pressure sensor section is anodically bonded, in a vacuum, to a glass mount with an evacuated space between the absolute-pressure sensor section and the mated surface portion of the glass mount. The pressure to be measured is received by the reverse surface of the gauge pressure sensor section. Since no complicated package is mounted within the outer package, the assembly of the sensor is easy. Further, since the pressure sensor has two sensor sections, namely, the gauge pressure sensor section and the absolute pressure sensor section, the sensor can be used as an absolute pressure sensor of the reverse-surface pressure-receiving type.

1 Claim, 2 Drawing Sheets

SEMICONDUCTOR PRESSURE SENSOR

BACKGROUND OF THE INVENTION

1. Field of the Invention

The present invention relates to a semiconductor pressure sensor of an improved structure which may be used in vehicles or the like. The present invention also relates to a method of manufacturing such a sensor.

2. Description of the Related Art

A conventional semiconductor pressure sensor is shown, in section, in FIG. 1. As shown in the drawing, an outer package 2 has a pressure introduction port 1. The outer package 2 accommodates a package 4 of a pressure sensor itself (hereinafter simply referred to as "package"), the package 4 being mounted on a ceramic substrate 3. A stem 5, including a pressure introduction pipe, is provided at the bottom of the package 4, with the pipe communicating with the pressure introduction port 1 of the outer package 2. A pressure sensor chip 7, which is joined to a glass mount 6 by anodic bonding, is disposed in the package 4, with the reverse surface of the chip 7 facing the pressure introduction port 1. The pressure sensor chip 7 is electrically connected, via wire leads 8 and leads 9, to conductive patterns 10 formed on the ceramic substrate 3. A vacuum prevails inside the package 4. An IC chip 11, such as a flip chip, is electrically connected to the conductor patterns 10 via bumps 12. The conductor patterns 10 are electrically connected, via outer leads 13, to a circuit outside the semiconductor pressure sensor.

The conventional semiconductor pressure sensor having the above-described construction is manufactured in the following manner. First, the pressure sensor chip 7 and the glass mount 6 are bonded together by anodic bonding, and the resultant body is die-bonded to the stem 5. Subsequently, the pressure sensor chip 7 and the leads 9 are connected by the wire leads 8. Thereafter, the pressure within the package 4 is reduced to a vacuum within, thereby forming a vacuum chamber 14. The thus obtained package 4 and the IC chip 11 are mounted on the ceramic substrate 3. Thereafter, the ceramic substrate 3 with the package 4 and the IC chip 11 is incorporated into the outer package 2, thereby completing the semiconductor pressure sensor.

The semiconductor pressure sensor is used in the following manner. The pressure of the gas to be measured is introduced from the pressure introduction port 1, which pressure is then received by the reverse surface of the pressure sensor chip 7. Since the front surface of the pressure sensor chip 7 is exposed to the vacuum within the chamber 14, the output of the pressure sensor chip 7 is an absolute-pressure output. The sensor output is amplified by an amplification circuit, such as that shown in FIG. 2, so as to obtain a signal output. In FIG. 2, reference numerals 7 and 11 respectively denote circuits formed in the pressure sensor chip 7 and the IC chip 11.

The conventional semiconductor pressure sensor entails the following problem. Since assembly is performed in two stages, that is, the assembly of the package 4 first, then the mounting of the package 4 and the IC chip 11 on the ceramic substrate 3, the required manufacturing processes are inevitably complicated and time-consuming. For instance, the vacuum chamber must be formed with a high level of precision.

SUMMARY OF THE INVENTION

The present invention has been accomplished with a view to overcoming the above-described problem.

It is an object of the present invention to provide a semiconductor pressure sensor which can be assembled with ease for pressure measurement even in a severe environment.

It is another object of the present invention to provide a method of manufacturing such a semiconductor pressure sensor.

According to one aspect of the present invention, there is provided a semiconductor pressure sensor comprising: an outer package having a pressure introduction port; a ceramic substrate accommodated in the outer package; an IC chip mounted on the ceramic substrate; a glass mount disposed on the ceramic substrate; and a pressure sensor chip formed with a gauge-pressure sensor section and an absolute-pressure sensor section, wherein the glass mount and the pressure sensor chip are anodically bonded together in a vacuum with an evacuated space between the reverse surface of the absolute-pressure sensor section and the mated surface portion of the glass mount, and through hole is formed in a certain portion of the glass mount and a certain portion of the ceramic substrate both adjacent to the reverse surface of the gauge-pressure sensor section, the reverse surface of the gauge-pressure sensor section communicating with the pressure introduction port through the through hole.

According to another aspect of the present invention, there is provided a method of manufacturing a semiconductor pressure sensor comprising the steps of: forming a first bore in a certain portion of a glass mount of the sensor which will correspond to the reverse surface of a gauge-pressure sensor section of the sensor; preparing a pressure sensor chip formed with the gauge-pressure sensor section and an absolute-pressure sensor section; anodically bonding together the pressure sensor chip and the glass mount in a vacuum with an evacuated space between the reverse surface of the absolute-pressure sensor section and the mated surface portion of the glass mount; forming a second bore in a certain portion of a ceramic substrate of the sensor which will correspond to the reverse surface of the gauge-pressure sensor section; mounting, on the ceramic substrate, the pressure sensor chip and the glass mount which have been anodically bonded together; mounting an IC chip of the sensor on the ceramic substrate; and incorporating the ceramic substrate with the above-described elements into an outer package of the sensor.

DETAILED DESCRIPTION OF THE PREFERRED EMBODIMENT

Figure 1:
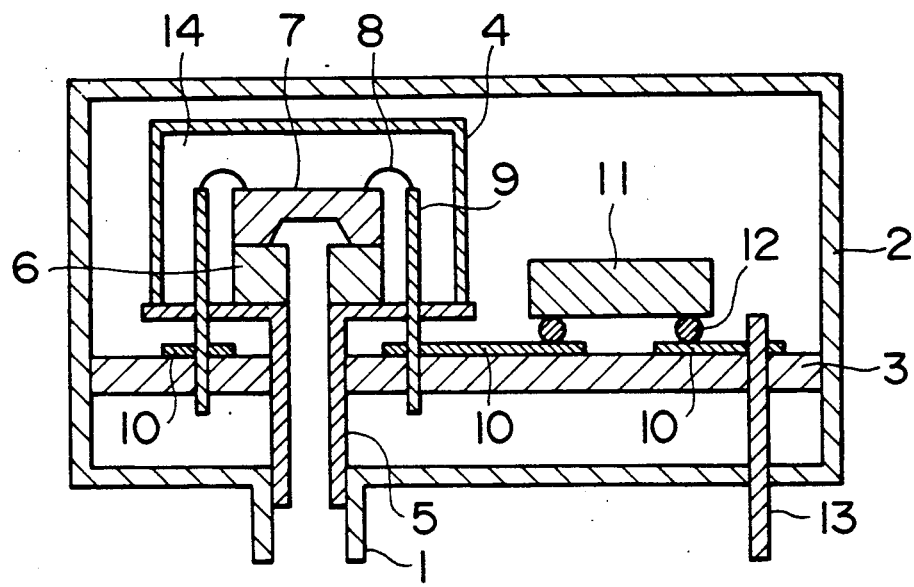
FIG. 1 is a sectional view of a conventional semiconductor pressure sensor.
Figure 2:
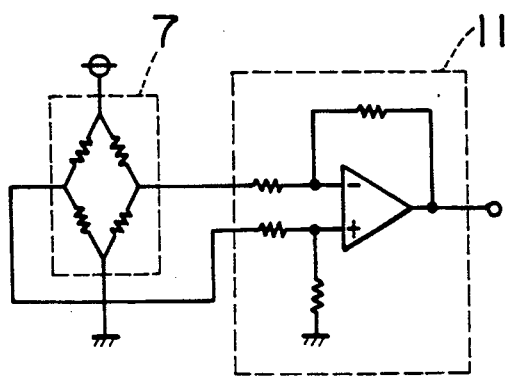
FIG. 2 is a circuit diagram of an amplification circuit combined with the sensor shown in FIG. 1.
Figure 3:
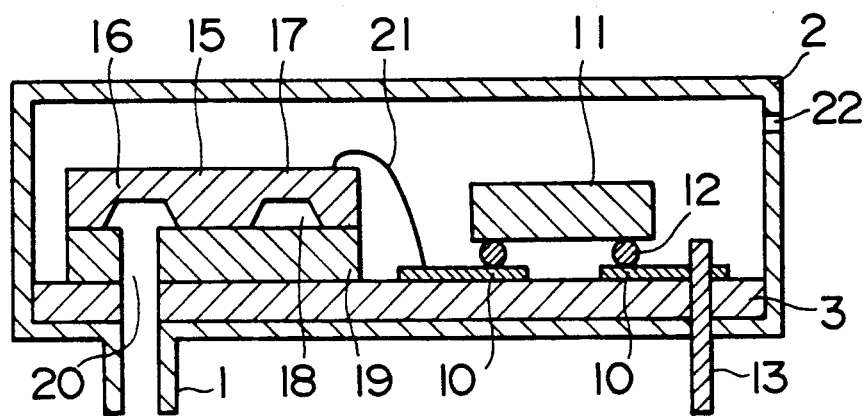
FIG. 3 is a sectional view of a semiconductor pressure sensor according to one embodiment of the present invention.

A semiconductor pressure sensor according to one embodiment of the present invention is shown, in section, in FIG. 3. Reference numerals 1 to 3 and reference numerals 10 to 13 respectively denote exactly the same component parts as those of the above-described conventional semiconductor pressure sensor. Referring to FIG. 3, a pressure sensor chip 15 has a gauge-pressure sensor section 16 and an absolute-pressure sensor section 17, which are integrated in one chip. The pressure sensor chip 15 is anodically bonded to a glass mount 19 with an evacuated space 18 between the reverse surface of the absolute-pressure sensor section 17 and the glass mount 19. The pressure sensor chip 15 and the glass mount 19 bonded together are mounted on the ceramic substrate 3. The glass mount 19 and the ceramic substrate 3 each have a bore 20 in the reverse surface of the gauge-pressure sensor section 16, so that the reverse surface of the gauge-pressure sensor section 16 communicates with the pressure introduction port 1 of the outer package 2 through the bores 20 constituting a through hole. The pressure sensor chip 15 is electrically connected, via wire leads 21, to conductor patterns 10 formed on the ceramic substrate 3. An IC chip 11, such as a flip chip, is also connected to the conductor patterns 10 via bumps 12. The conductor patterns 10 are electrically connected, via outer leads 13, to a circuit outside the semiconductor pressure sensor.

The above-described members, such as the pressure sensor chip 15, the ceramic substrate 3 and the IC chip 11, are accommodated within the outer package 2. An atmospheric pressure introduction port 22 is provided at an upper position of the outer package 2.

The semiconductor pressure sensor having the above-described construction is manufactured in the following manner. First, the pressure sensor chip 15 having the two sensor sections 16 and 17 is anodically bonded, in a vacuum, to the glass mount 19 already formed with the bore 20 at a position which will correspond to the reverse surface of the gauge-pressure sensor section 16. Anodic bonding enables the sensor chip 15 and the glass mount 19 to be bonded together without using a bonding material and with a high degree of air-tightness, thereby facilitating the formation of a vacuum space 18. With this method, there is no need to form a separate vacuum chamber. In addition, since the two sensor sections can be unified with the glass mount 19 at one time, the required manufacturing processes are simple. Subsequently, the pressure sensor chip 15, which has been anodically-bonded to the glass mount 19, and the IC chip 11 are mounted on the ceramic substrate 3. Finally, the resultant ceramic substrate 3 is incorporated into the outer package 2.

Figure 4:
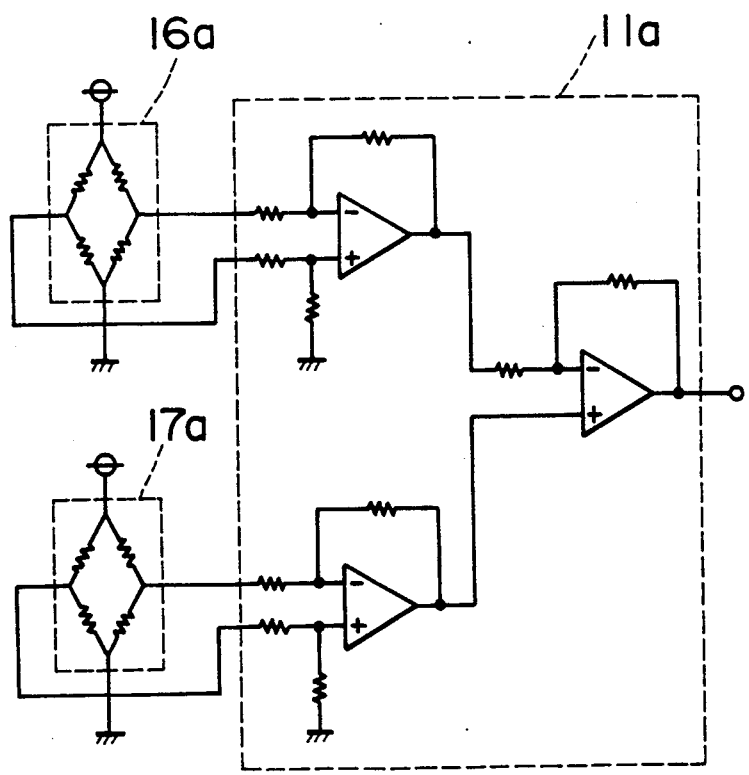
FIG. 4 is a circuit diagram of an amplification circuit combined with the sensor shown in FIG. 3.

The thus manufactured semiconductor pressure sensor operates in the following manner. A gas of which the pressure is to be measured, is introduced through the pressure introduction port 1. The gas pressure is received by the reverse surface of the gauge-pressure sensor section 16. The output of this sensor section 16, indicative of the received pressure, serves as a gauge-pressure output. Since the gauge-pressure sensor section 16 includes no circuits, such as resistors, formed on the reverse surface thereof, the sensor is capable of being used in a severe environment. The absolute-pressure sensor section 17 detects the atmospheric pressure, and generates an output indicative of this detection. An amplification circuit, such as that shown in FIG. 4, amplifies the output of the gauge-pressure sensor section 16 while using, as the reference, the output of the absolute-pressure sensor section 17. The output of the amplification circuit is obtained as an absolute-pressure output. In FIG. 4, reference numerals 11a, 16a and 17a respectively denote circuits formed on the IC chip 11, the gauge-pressure sensor section 16 and the absolute-pressure sensor section 17.

As described above, according to the present invention, a sensor chip having two sensor sections, namely, an absolute-pressure sensor section and a gauge-pressure sensor section, can be joined to a glass mount in one stage. This makes it unnecessary to mount a package of the pressure sensor itself, and makes it possible to simplify the entire manufacturing process. Another advantage is that the semiconductor pressure sensor, in which the pressure to be measured is received by the reverse surface of the pressure sensor chip, is capable of withstanding a severe environment.

What is claimed is:

1. A semiconductor pressure sensor comprising:
   an outer package having a pressure introduction port for introducing a gas for making a pressure measurement and an atmospheric pressure introduction port for introducing gas at atmospheric pressure into the outer package;
   a ceramic substrate directly mounted to and within the outer package and including a passage aligned with the pressure introduction port;
   a glass mount disposed within the outer package on the ceramic substrate and including a passage aligned with the passage in the ceramic substrate and with the pressure introduction port;
   a pressure sensor chip having opposed front and rear surfaces including a gauge pressure sensor section producing an electrical signal indicative of the difference between the pressure in the gas introduction port and atmospheric pressure and an absolute pressure sensor section producing an electrical signal indicative of the difference between atmospheric pressure and a vacuum wherein the glass mount and the pressure sensor chip are anodically bonded together at the rear surface of the pressure sensor chip and mounted within the outer package, the absolute pressure sensor section including an evacuated space at the rear surface of the pressure sensor chip and the glass mount, the gauge pressure sensor communicating at the rear surface of the pressure sensor chip with the pressure introduction port through the passages in the ceramic substrate and glass mount, atmospheric pressure being admitted into the outer package by the atmospheric pressure introduction port reaching the front surface of the pressure sensor chip;
   an IC chip mounted on the ceramic substrate within the outer package and electrically connected to the gauge pressure sensor section and the absolute pressure sensor section for generating an electrical signal indicative of the absolute pressure in the gas introduction port; and
   electrical leads extending through the ceramic substrate and outside of the outer package electrically connected to the IC chip for conducting the electrical signal indicative of the absolute pressure of the gas in the gas introduction port.

* * * * *